United States Patent
Nawada

(10) Patent No.: US 11,518,088 B2
(45) Date of Patent: Dec. 6, 2022

(54) STEREO LITHOGRAPHIC 3D PRINTING ASSEMBLY AND STEREO LITHOGRAPHIC 3D PRINTING METHOD

(71) Applicant: UNIVERSITEIT VAN AMSTERDAM, Amsterdam (NL)

(72) Inventor: Suhas Nawada, Amsterdam (NL)

(73) Assignee: UNIVERSITEIT VAN AMSTERDAM, Amsterdam (NL)

( * ) Notice: Subject to any disclaimer, the term of this patent is extended or adjusted under 35 U.S.C. 154(b) by 0 days.

(21) Appl. No.: 17/604,870

(22) PCT Filed: Apr. 20, 2020

(86) PCT No.: PCT/EP2020/061014
§ 371 (c)(1),
(2) Date: Oct. 19, 2021

(87) PCT Pub. No.: WO2020/212625
PCT Pub. Date: Oct. 22, 2020

(65) Prior Publication Data
US 2022/0088853 A1    Mar. 24, 2022

(30) Foreign Application Priority Data
Apr. 19, 2019   (EP) .................................. 19170376

(51) Int. Cl.
*B29C 64/286*   (2017.01)
*B29C 64/129*   (2017.01)
(Continued)

(52) U.S. Cl.
CPC .......... *B29C 64/129* (2017.08); *B29C 64/286* (2017.08); *B33Y 10/00* (2014.12); *B33Y 30/00* (2014.12)

(58) Field of Classification Search
CPC ... B29C 64/129; B29C 64/264; B29C 64/268; B29C 64/277; B29C 64/282; B29C 64/286
See application file for complete search history.

(56) References Cited

U.S. PATENT DOCUMENTS 9,733,429 B2   8/2017  Page et al.
9,862,147 B2   1/2018  Jeng et al.
(Continued)

FOREIGN PATENT DOCUMENTS

WO   2015007772 A1   1/2015

OTHER PUBLICATIONS

Extended European Search Report and Search Opinion, Patent Application No. EP19170376 8, dated Nov. 12, 2019, 10 pages.
(Continued)

*Primary Examiner* — Joseph S Del Sole
*Assistant Examiner* — Jamel M Nelson
(74) *Attorney, Agent, or Firm* — AEON Law, PLLC; Adam L. K. Philipp; David V. H. Cohen

(57) ABSTRACT

The invention provides a stereo lithographic 3D printing assembly comprising a digital projection system for projecting a first pattern having a first resolution at a projection location, and a photo mask system for projecting a second pattern having a second resolution at said projection location. This provides a fast 3D printing assembly allowing high resolution details.

14 Claims, 4 Drawing Sheets

(51) Int. Cl.
  *B33Y 10/00*     (2015.01)
  *B33Y 30/00*     (2015.01)

(56)         References Cited

U.S. PATENT DOCUMENTS

| 2004/0019408 | A1  | 1/2004  | Puerto et al. |
| 2016/0368210 | A1* | 12/2016 | Chen .................... B29C 64/106 |
| 2018/0056605 | A1  | 3/2018  | Chen et al. |
| 2018/0126647 | A1* | 5/2018  | Schultheiss ........... G03F 7/2008 |
| 2019/0084241 | A1* | 3/2019  | Krishnaswamy ..... B29C 64/268 |

OTHER PUBLICATIONS

International Search Report and Written Opinion, International Application No. PCT/EP2020/061014, dated Jul. 15, 2020, 14 pages.

Zhou et al., "A Novel Low-Cost Stereolithography Process Based on Vector Scanning and Mask Projection for High-Accuracy, High-Speed, High-Throughput, and Large-Area Fabrication", J. Comput. Inf. Sci. Eng., vol. 15, No. 1, Mar. 2015, 011003 (8 pages).

\* cited by examiner

STEREO LITHOGRAPHIC 3D PRINTING ASSEMBLY AND STEREO LITHOGRAPHIC 3D PRINTING METHOD

CROSS-REFERENCE TO RELATED APPLICATIONS

This application is a U.S. National Phase of and claims priority to PCT International Phase Application No. PCT/EP2020/061014, filed Apr. 20, 2020, which claims priority to European Patent Application No. 19170376.8, filed on Apr. 19, 2019. The entire contents of the above-referenced applications and of all priority documents referenced in the Application Data Sheet filed herewith are hereby incorporated by reference for all purposes.

FIELD OF THE INVENTION

The invention relates to a stereo lithographic 3D printing assembly, a stereo lithographic 3D printing method, and a computer program product for controlling a stereo lithographic 3D printing assembly.

BACKGROUND OF THE INVENTION

U.S. Pat. No. 9,733,429 according to its abstract describes "A system and method for forming microlattice structures of large thickness. In one embodiment, a photomonomer resin is secured in a mold having a transparent bottom, the interior surface of which is coated with a mold-release agent. A substrate is placed in contact with the top surface of the photomonomer resin. The photomonomer resin is illuminated from below by one or more sources of collimated light, through a photomask, causing polymer waveguides to form, extending up to the substrate, forming a microlattice structure connected with the substrate. After a layer of microlattice structure has formed, the substrate is raised using a translation-rotation system, additional photomonomer resin is added to the mold, and the photomonomer resin is again illuminated through the photomask, to form an additional layer of microlattice structure. The process is repeated multiple times to form a stacked microlattice structure."

U.S. Pat. No. 9,862,147 according to its abstract describes "A method of photo-curing a photo-sensitive resin is disclosed in the present invention. The method includes the following steps: generating a sub-pixel pattern having an outer contour region and an inner contour region based on a vector file taken from a cross-section of a model; providing the sub-pixel pattern to a photomask module, wherein the photomask module includes a panel having a pixel matrix including plural square pixels, each of which includes three color-filtered sub-pixels; flood-filling color in each of the color-filtered sub-pixels to distinguish the outer contour region from the inner contour region; and exposing the photo-sensitive resin to a light source emitting a light passing through the panel."

US20180056605 according to its abstract describes "A three-dimensional printing system includes a build device and an optical projection engine. The build device includes a curing tank, a photocurable material and a build platform, and the photocurable material and the build platform is disposed in the curing tank. The optical projection engine has a zoom lens for projecting image beams with at least a first pixel size and a second pixel size on the build platform to cure the photocurable material, and the first pixel size is different to the second pixel size."

US2018126647 according to its abstract describes "The invention relates to a device for correcting an inhomogeneous intensity distribution of a radiation field generated by a radiation source, in particular a radiation source for a device for producing three-dimensional articles by the layer-by-layer solidifying, in a build plane, of a material that is solidifiable under the action of radiation. The device comprises a correcting or filtering device that is to be introduced, between the radiation source and the build plane, into a radiation path of a device for producing three-dimensional articles by the layer-by-layer solidifying of a material that is solidifiable under the action of radiation. Further, improved methods for producing a device for correcting an inhomogeneous intensity distribution of a radiation field generated by a radiation source, and methods and devices for producing a three-dimensional article are proposed."

WO2015007772 according to its abstract describes "The invention relates to a method for producing a three-dimensional object (12) by solidifying layer by layer a material (16) that can be solidified by the action of radiation (14) using exposure masks (28), wherein at least one, preferably a single digital exposure mask is generated for forming each object layer to be solidified of the object (12) in a construction plane (22), by means of which exposure mask the radiation is projected selectively into the construction plane. According to the invention, the method is improved in that three-dimensional objects having an improved, smoother surface can be produced simply by exposing the construction plane (22) in an oscillating manner during an exposure time. The invention also relates to an improved exposure mask generation device and an improved device for producing a three-dimensional object."

CHI ZHOU et al: "A Novel Low-Cost Process Based on Vector Projection for High-Speed, and Large-Area Stereo lithography Scanning and Mask High-Accuracy, High-Throughput, Fabrication", published 1 Mar. 2015, in its abstract states: "Photopolymerization based process is one of the most popular additive manufacturing (AM) processes. Two primary configurations for this process are laser based vector by vector scanning (0D) and projection based layer by layer exposing (2D). With the highly focused fine laser, the scanning based process can accomplish very high surface finishing and precision, however, due to the serial nature of scanning, this process suffers from the problem of slow speed. In contrast with laser scanning, projection based process can form the whole layer in one exposure, which leads to higher fabrication efficiency. However, due to the limited resolution of projection device and various optical defects, the surface quality will be significantly deteriorated for large area fabrication. To solve this problem, a novel hybrid process by integrating vector scanning and mask projection has been presented. In this process, laser is focused into a fine spot and used to scan the boundary of the layer, whereas the projector is focused onto a large platform surface and used to form the interior area of the layer. An efficient slicing method is proposed for extracting the contour for laser scanning. A slice to image conversion algorithm is also developed to convert the offset contour to grayscale image for mask projection. Experimental results have verified that the proposed hybrid process can significantly improve the fabrication speed without losing the surface quality."

US2019/084241 in its abstract states: "A multiscale multiphoton photolithography system for fabricating a 3D object may comprise a support structure configured to support a light-sensitive composition from which the 3D object is to be fabricated; a microscope objective configured to focus light on the light-sensitive composition via an optical path; a first optical assembly configured to provide light of a first wavelength to the microscope objective, the first wavelength selected to induce a single photon process in the light-sensitive composition; a second optical assembly configured to provide light of a second wavelength to the microscope objective, the second wavelength selected to induce a multiphoton process in the light-sensitive composition; and a controller operably coupled to the first and second optical assemblies. The controller comprises a processor and a non-transitory computer-readable medium operably coupled to the processor, the computer-readable medium comprising instructions that, when executed by the processor, perform operations comprising illuminating, via the first optical assembly, the light-sensitive material with the first wavelength of light via the optical path to generate a first region of the 3D object via single photon photolithography; illuminating, via the second optical assembly, the light-sensitive material with the second wavelength of light via the optical path to generate a second region of the 3D object via multiphoton photolithography; and repeating steps (a) and (b) until the 3D object is complete."

US 2004/019408 in its abstract states: "A lithography tool includes an exposure chamber and a reticle handler that exchanges a reticle being exposed as prescribed by the user of the lithography tool. The reticle handler can include a vacuum-compatible robot, a vacuum chamber to house the robot, a load-lock to input reticles and transition them from atmospheric pressure to vacuum, a processing station for processing the reticle, and a reticle library for storing at least one extra reticle so that it is quickly available for exchange during an exposure process. The robot can have a two or more handed gripper to simultaneously hold multiple reticles. This allows a first reticle to be removed from the reticle stage with a first hand and a second reticle to be loaded onto the reticle stage with a second hand, and so on, which minimizes exchange time."

SUMMARY OF THE INVENTION

One or more disadvantages of the prior art amongst others that these different methods offer a trade-off between resolution and printable object size. Methods to print large objects cannot currently provide sub-μm resolutions and high-resolution printing techniques cannot 3d-print objects (several cm3 in volume) within reasonable timeframes.

Hence, it is an aspect of the invention to provide an alternative 3D printing method, which preferably further at least partly obviates one or more of above-described drawbacks.

There is currently provided a stereo lithographic 3D printing assembly comprising a digital projection system for projecting a first pattern having a first resolution at a projection location, and a photo mask system for projecting a second pattern having a second resolution at said projection location.

There is further provided a stereo lithographic 3D printing add-on assembly comprising photo-masks for creating micro-features such as cavities or channels, a photo-mask selection system for creating predefined repeating micro-features such as ordered lattices, a linear actuator and a controller for selecting at least one photo mask from said photo masks for making said predefined repeating micro features and for controlling said linear actuator for positioning said selected at least one photo mask with respect to said projection optics and said projection location for producing said predefined repeating micro features.

There is furthermore provided a stereo lithographic 3D printing method, comprising:
projecting a first pattern having a first resolution at a projection location in a resin container during a stereo lithographic 3D printing process using projection optics;
providing at least one photo-mask between said a resin container and said projecting optics;
projecting at least one photo mask pattern at said projection location using said at least one photo-mask to project a second pattern having a second resolution at said projection location for providing said second pattern on said first pattern.

There is furthermore provided a computer program product to align the stereolithographic and photolithographic patterns.

The combination of stereo- and photo-lithographic polymerization-based 3D-printing process that allows for a high-volume and high-resolution 3D-printing using a stereolithographic process. A computer program product is provided to align the stereolithographic and photolithographic patterns.

The method described herein comprises a digital illumination system (e.g. digital mirror device, LCD, Liquid Crystal on Silicon or laser-scanning methods) to 3D-print larger features (named here as macro-patterns) with full three-dimensional conformity. The method also includes a photo-mask system comprising a photo-mask patterns to print smaller features (named here as micro-patterns), a translation or rotation stage to switch between different photo-mask patterns.

Just in order to avoid confusion, 3D printing in also referred to as additive manufacturing. It allows the production of 3D objects by adding layer after layer of material.

Combining the two approaches allows for producing parts that neither method can by itself (with resolution, scale and three-dimensional conformity). For example, the shapes for a large object (up to 500×500 cm using current stereolithographic methods) at low resolutions while simultaneously, one or more photo-mask patterns with sub-μm features can be cycled through as the piece is printed. This would create large parts with ordered, repeating micro-structures. The macro-structure (i.e. the general shape of the object) would be defined digitally whereas the micro-features would be defined by the photo-mask system.

The method described here can therefore produce a 100-1000-fold improvement in resolution compared to traditional stereolithographic methods without compromising on the size of the printed objects. Alternatively, the method is a 100-1000-fold reduction in printing time compared to high-resolution printing methods such as two-photon polymerization. The method is particularly useful where repeating, ordered micro-structures are necessary while the large macro-structure with full conformity.

The current assembly can be used in different fields. Examples are the following.

Tissue Scaffolds: Printing organs with porous structures to promote cell growth and create made-to-order organs for every patient. In this case, the organs themselves are the macro-features with feature sizes>500 μm. Porous lattices with high surface area to volume ratios can be created using photo-mask patterning to create the micro-features necessary for cell growth.

Metamaterials: Ultra-light weight, robust lattices known as "metamaterials" have been a key application in high resolution 3D-printing (i.e. feature sizes of <100 μm). Sectors as diverse as aerospace, furniture design and the automotive field can benefit from the current assembly and method. A limitation of known technologies is combining resolution and part size for functional parts.

Liquid Chromatography Columns: Current liquid chromatography relies on particles under 5 μm that are random packed into a column. The benefits or an entirely ordered porous media that 3D-printing can create have been demonstrated using simulations and experiments. However, low printing resolutions (or long build times with two-polymerization) have limited the development of 3D-printed columns at a scale that is applicable to preparative or analytical scale separations. The proposed assembly and method allows for the creation of simple repeating porous grids while meeting the physical requirements of a liquid chromatography column; both in terms of resolution and build volume.

Microfluidic Devices: Microfluidic and lab-on-a-chip devices have traditionally used planar photo-lithographic techniques, are highly time consuming and often require cleanroom facilities. Known 3D-printing offers the opportunity to create fully three-dimensional designs at a fraction of the time and cost. However, the resolutions of known stereo lithographic assemblies can only create "milli-fluidic" devices rather than microfluidic devices, often defeating the purpose of miniaturization. The current assembly and method combines the advantages of both techniques to create ultra-high resolution, intricate chip designs with production times and costs that can make the sale of microfluidic devices an attractive commercial proposition. Macro-features such as connecting ports, and solvent reservoirs can be defined by the known process part while the microchannels can be created using proposed additional features.

In an embodiment of the assembly, said second resolution is at least ten times higher than said first resolution at said projection location.

In an embodiment, the first resolution is lower than 200 dots per inch, and said second resolution is higher than 200 dots per inch. In a particular embodiment said first resolution is lower than 250 dots per inch, and said second resolution is higher than 250 dots per inch. In yet a more particular embodiment, said first resolution is lower than 100 dots per inch, and said second resolution is higher than 300 dots per inch. In embodiments, the first resolution is even lower, for allowing faster printing of certain structures, while the second resolution may even be higher, even up to 600 dots per inch and higher.

In an embodiment, said digital projection system comprises a source of electromagnetic radiation for producing a beam of electromagnetic radiation, collimating optics downstream of said source of electromagnetic radiation for collimating said beam of electromagnetic radiation, a digital mirror device downstream of said collimating optics, and an at least one axis translation device for translating said projection location, wherein said photo mask system is provided for positioning at least one photomask in a collimated beam of said collimating optics. In an embodiment, the electromagnetic radiation is in the ultra-violet or visible light range.

In an embodiment, said digital projection system comprises a light source, collimating optics downstream of said light source, a digital mirror device downstream of said collimating optics, and an at least one axis translation device for translating said projection location.

In an embodiment, said digital projection system comprises a patterned light source, collimating optics downstream of said patterned light source, and an at least one axis translation device for translating said projection location.

In an embodiment, the stereo lithographic 3D printing assembly further comprises a container for holding a photo-curable resin and a target surface for defining said projection location for receiving a solidified layer that is polymerized with radiation from said digital projection system.

In an embodiment, the photo-mask system comprises a series of photo-masks and selection system for selecting at least one of said photo-masks for generating said second pattern. This makes the assembly even more versatile. A fine pattern can be disassembled into a combination of base patterns, and photo-masks representing these base patterns can be combined, even dynamically, to produce the fine pattern. This allows for instance a fine pattern to change during the process. In this way, for instance channels that run in a 3D complex manner can be created.

In an embodiment, the photo-mask system comprises an actuator for displacing said at least one photo-mask during projecting of said first pattern for generating said second pattern, in particular said actuator comprises at least one selected from a translation stage and a rotation stage. This allows for a pattern to be created for instance at a selected position in the lower resolution first pattern.

In an embodiment, the photo mask system is provided as an add-on system to a stereo lithographic 3D printing assembly. This allows spectacular improvements on existing stereo lithographic 3D printing systems.

There is further provided a stereo lithographic 3D printing add-on assembly, in particular for the stereo lithographic 3D printing add-on assembly described earlier, comprising:
  at least one photo-mask for creating at least one micro-feature, such as cavities or channels;
  an actuator for displacing said photo-mask during operation of said stereo lithographic system, and
  a controller for controlling said actuator for positioning said at least one photo mask, said projection optics and said projection location with respect to one another for producing said predefined repeating micro features.

In an embodiment, the stereo lithographic 3D printing add-on assembly comprises a series of photo-masks, and
  a photo-mask selection system for selecting at least one photo-mask from said series of photo-masks for creating predefined micro-features such as ordered lattices;
  a controller for selecting at least one photo mask from said series of photo-masks for making said predefined repeating micro features and for controlling said actuator for positioning said selected at least one photo mask, said projection optics and said projection location with respect to one another for producing said predefined repeating micro features.

In an embodiment of the stereo lithographic 3D printing method, it further comprises:
  providing an actuator for displacing the at least one photo mask;
  moving, in particular selected from rotating, translating, and a combination thereof, said at least one photo-mask during said stereo lithographic printing process in coordination with said projecting of said first pattern.

In an embodiment of the stereo lithographic 3D printing method, it further comprising:
  providing a series of said at least one photo-mask;
  selecting at least one photo mask from said series of said at least one photo-mask;
  changing said second pattern during said projecting of said first pattern, said changing comprising at least one selected from removing, adding, replacing at least one of said selected at least one photo-mask, and a combination thereof.

In an embodiment of the stereo lithographic 3D printing method, at least one photo-mask is provided that comprises a repeating pattern, for generating a second pattern producing at least one three-dimensional ordered lattice having said second resolution.

There is further provided a computer program product for controlling the stereo lithographic 3D printing assembly for producing a three-dimensional object, which computer program product, when running on a data processor:
- decomposes said three-dimensional object into separate slices to be projected at said projection location;
- decomposes each slice into a said first pattern with said first resolution;
- decomposes each slice into a said second pattern with said second resolution;
- decomposes said second pattern into a selection of at least one basic photo-mask from a series of basic photo-masks, each basic photomask having a basic pattern;
- decomposes subsequent slices into a displacement of said first pattern;
- decomposes subsequent slices into a displacement of said second pattern, and
- provides control instructions to control said digital projection system and said photomask system to generate said first pattern and said second pattern simultaneously for producing said three-dimensional object.

There is further provided a computer program product for controlling the stereo lithographic 3D printing add-on assembly for producing a three-dimensional object, which computer program product, when running on a data processor:
- retrieves a decomposition of said three-dimensional object into separate slices to be projected at said projection location;
- retrieves a said first pattern having a first resolution and corresponding to each slice;
- subtracts said first pattern from said corresponding slice providing amended slices;
- decomposes each amended slice into a said second pattern with said second resolution;
- decomposes said second pattern into a selection of at least one basic photo-mask from a series of basic photo-masks, each basic photomask having a basic pattern;
- retrieving for subsequent slices a displacement of said first pattern;
- decomposes subsequent slices into a displacement of said second pattern, and
- provides control instructions to control said photomask system in synchronization with said further stereo lithographic 3D printing system to generate said first pattern and said second pattern simultaneously for producing said three-dimensional object.

This computer program product allows an improvement on existing assemblies.

The invention further pertains to a stereo lithographic 3D printing assembly comprising a digital projection system for projecting a first pattern having a first resolution at a projection location, and a photo mask system for projecting a second pattern having a second resolution at said projection location.

The invention further pertains to a stereo lithographic 3D printing add-on assembly comprising:
- at least one photo-mask for creating at least one micro-feature, such as cavities or channels;
- an actuator for displacing said photo-mask during operation of said stereo lithographic system, and
- a controller for controlling said actuator for positioning said at least one photo mask, said projection optics and said projection location with respect to one another for producing said predefined repeating micro features.

The terms "upstream" and "downstream" relate to an arrangement of items or features relative to the propagation of the light from a light generating means (here the especially the first light source), wherein relative to a first position within a beam of light from the light generating means, a second position in the beam of light closer to the light generating means is "upstream", and a third position within the beam of light further away from the light generating means is "downstream".

The term "substantially" herein, such as in "substantially consists", will be understood by the person skilled in the art. The term "substantially" may also include embodiments with "entirely", "completely", "all", etc. Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of".

The term "functionally" will be understood by, and be clear to, a person skilled in the art. The term "substantially" as well as "functionally" may also include embodiments with "entirely", "completely", "all", etc. Hence, in embodiments the adjective functionally may also be removed. When used, for instance in "functionally parallel", a skilled person will understand that the adjective "functionally" includes the term substantially as explained above. Functionally in particular is to be understood to include a configuration of features that allows these features to function as if the adjective "functionally" was not present. The term "functionally" is intended to cover variations in the feature to which it refers, and which variations are such that in the functional use of the feature, possibly in combination with other features it relates to in the invention, that combination of features is able to operate or function. For instance, if an antenna is functionally coupled or functionally connected to a communication device, received electromagnetic signals that are receives by the antenna can be used by the communication device. The word "functionally" as for instance used in "functionally parallel" is used to cover exactly parallel, but also the embodiments that are covered by the word "substantially" explained above. For instance, "functionally parallel" relates to embodiments that in operation function as if the parts are for instance parallel. This covers embodiments for which it is clear to a skilled person that it operates within its intended field of use as if it were parallel.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices or apparatus herein are amongst others described during operation. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device or apparatus claims enumerating several means, several of these means may be embodied by one and the same item of hardware. The mere fact that certain measures are recited in mutually different dependent claims does not indicate that a combination of these measures cannot be used to advantage.

The invention further applies to an apparatus or device comprising one or more of the characterising features described in the description and/or shown in the attached drawings. The invention further pertains to a method or process comprising one or more of the characterising features described in the description and/or shown in the attached drawings.

The various aspects discussed in this patent can be combined in order to provide additional advantages. Furthermore, some of the features can form the basis for one or more divisional applications.

BRIEF DESCRIPTION OF THE DRAWINGS

Embodiments of the invention will now be described, by way of example only, with reference to the accompanying schematic drawings in which corresponding reference symbols indicate corresponding parts, and in which.

The drawings are not necessarily on scale

DESCRIPTION OF PREFERRED EMBODIMENTS

FIGS. 1-4 schematically depicts an embodiment of a stereo lithographic printing assembly 1. The assembly 1 comprises a digital projection system 2. This digital projection system as such is well known in the arts. The light source for the digital projection system can comprise a UV or visible-light LED system or mercury-arc lamp. The projected image can be defined by a digital mirror device (DMD), laser-rastering or laser screening, liquid crystal display (LCD) or a liquid crystal on silicon-based illumination system.

Figure 1:
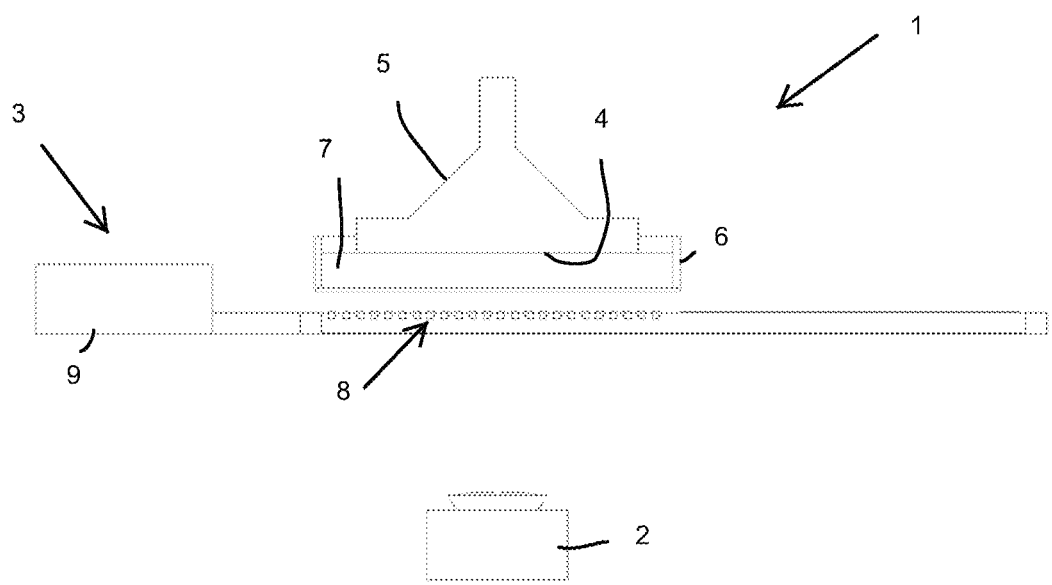
FIG. 1 schematically depicts a side view of an embodiment of the assembly.
Figure 2:
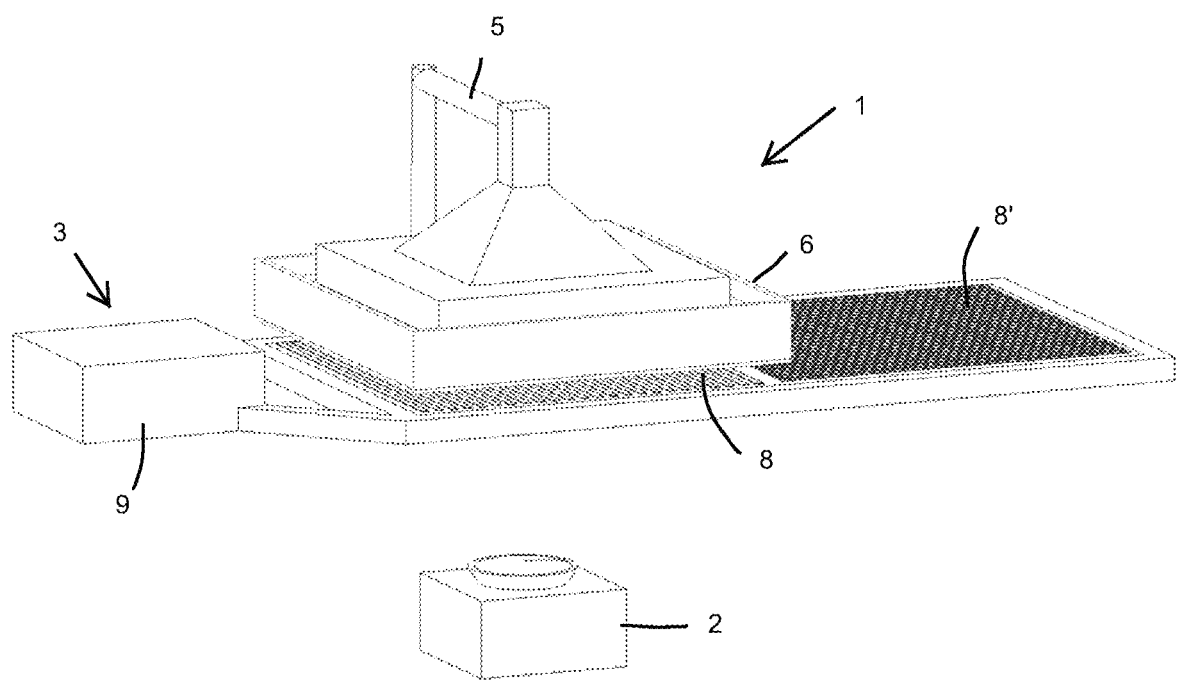
FIG. 2 a perspective view of FIG. 1.
Figure 3:
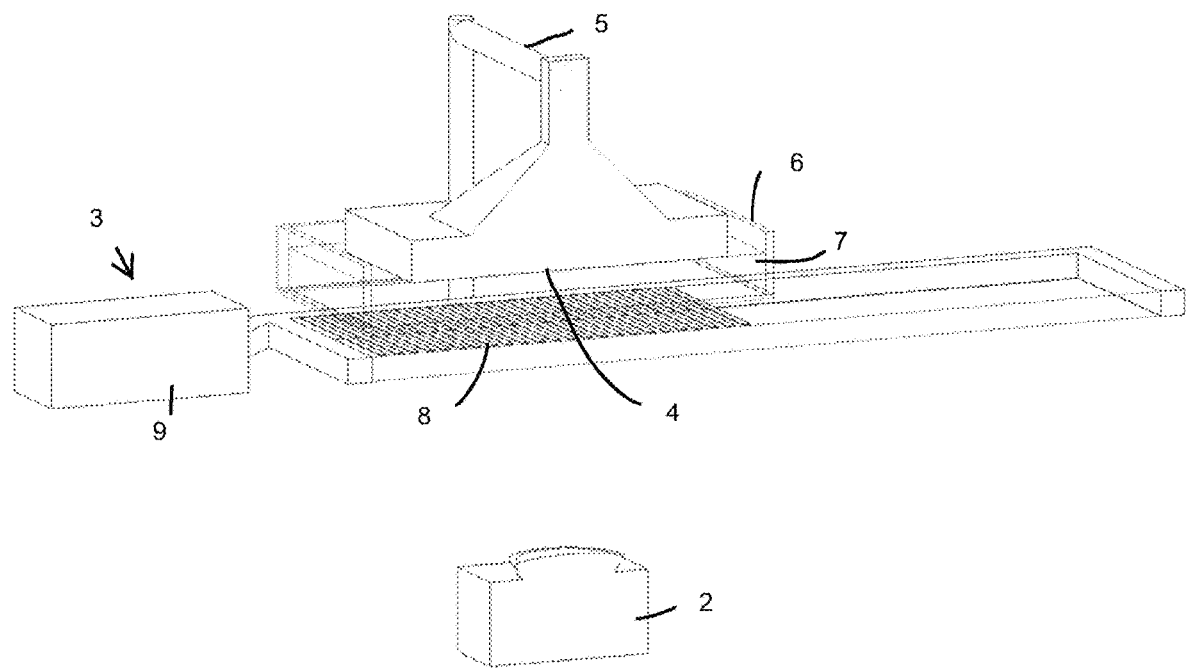
FIG. 3 a cross sectional view of FIG. 1.
Figure 4:
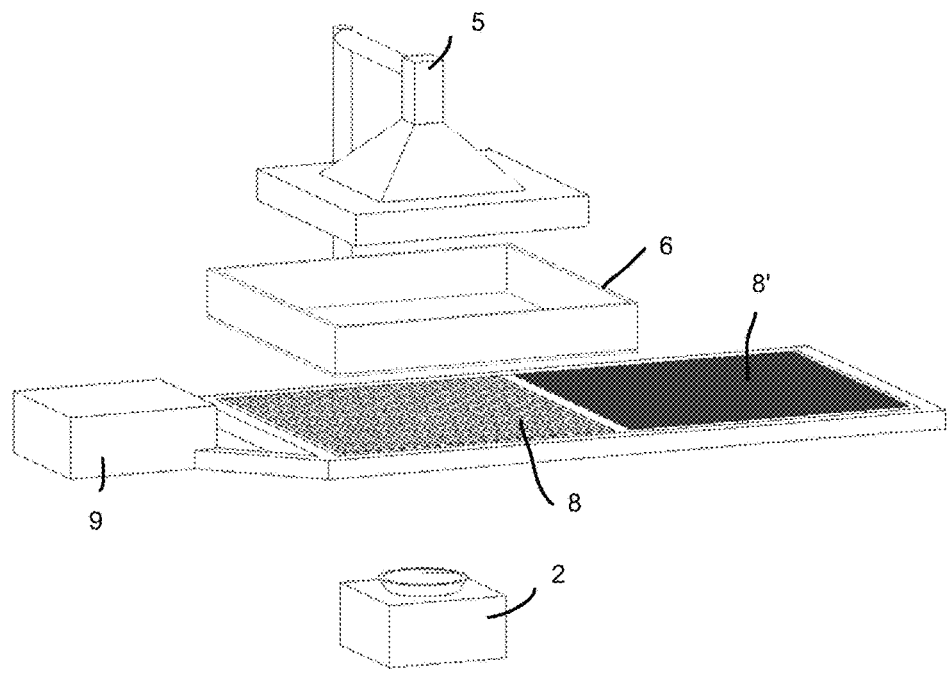
FIG. 4 an expanded view of FIG. 1.

The stereo lithographic printing system 1 comprises a surface 4 defining a projection location. Often, such a surface will be a flat surface. The surface is attached to a displacement system 5. Often, such a displacement system 5 will comprise a so called Z-axis displacement table. This can move the surface 4 up and down, i.e., as indicated in FIG. 1.

The stereo lithographic printing system 1 further comprises a container 6 for holding a polymerizable resin 7.

The stereo lithographic printing system 1 further comprises a photo mask system 3. The photo mask system 3 comprises a frame holding a first mask 8 and in this embodiment also a second mask 8'. The photo mask system 3 further comprises an actuator 9 for translating the masks 8, 8' in the X-Y plane (indicated). In an embodiment, the actuator has a micro translation setting for moving or translating a mask 8, 8' just a minor amount, usually in the order of microns, and a macro translation setting, for instance for replacing mask 8 with mask 8' and vice versa.

####Mask 8, 8' is a pattern permanently defined on a substrate. Possible substrate examples include soda lime, quartz, or Teflon. Alignment can be added, e.g., with a photomask translation table, a calibration spot on a photomask, a detector, and/or software matching spots.

Figure 5:
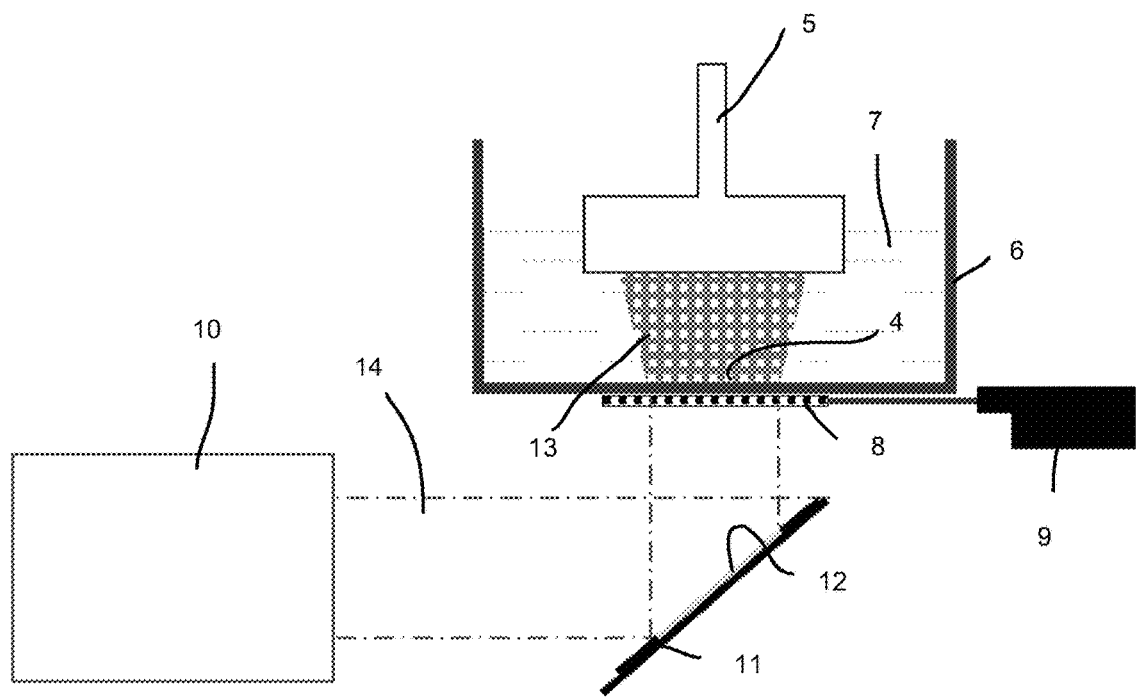
FIG. 5 an alternative setup showing an object being printed.

In FIG. 5, a further schematic embodiment of a stereo lithographic printing system 1 is depicted, showing details of an embodiment of the digital projection system 2. In this embodiment, a light source and collimating optics system 10 are provided to produce a collimated optical beam 14. The system 10 projects a beam 14 on a mirror 11 set here at 45 degrees with respect to the surface 4. In this embodiment, the mirror 11 is provided with a first pattern 12. Such a pattern 12 can be static. In an embodiment, the pattern 12 is dynamic, for instance comprising an LCD or DMD element allowing the pattern 12 to be changed.

In FIG. 5, formation of an object 13 is indicated in an embodiment of the current system. In this embodiment, a next layer of the object is formed at projection surface 4'. This projection surface 4' is in fact one end of the object 13 that is being formed. The displacement system 5 translates the object in the Z-direction, pulling it in fact out of the resin 7. When pulling the object in the Z-direction, new resin flows between the just-formed new layer of the object 13 and the (optically transparent) bottom 15 of resin container 6.

Figure 6:
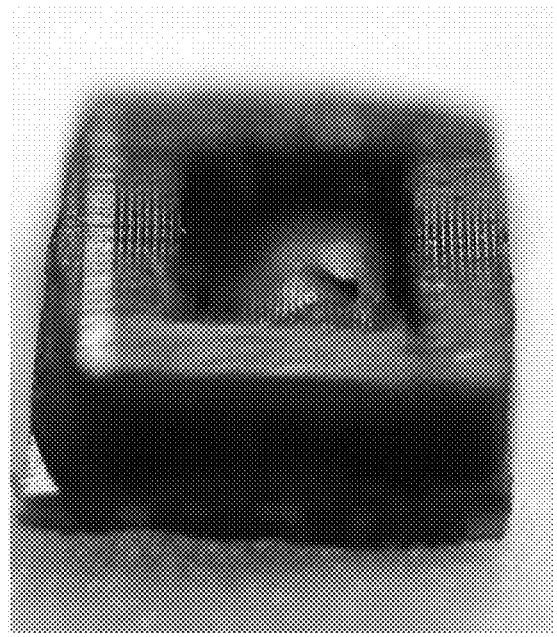
FIG. 6 a photograph showing an object with a micro pattern.
Figure 7:
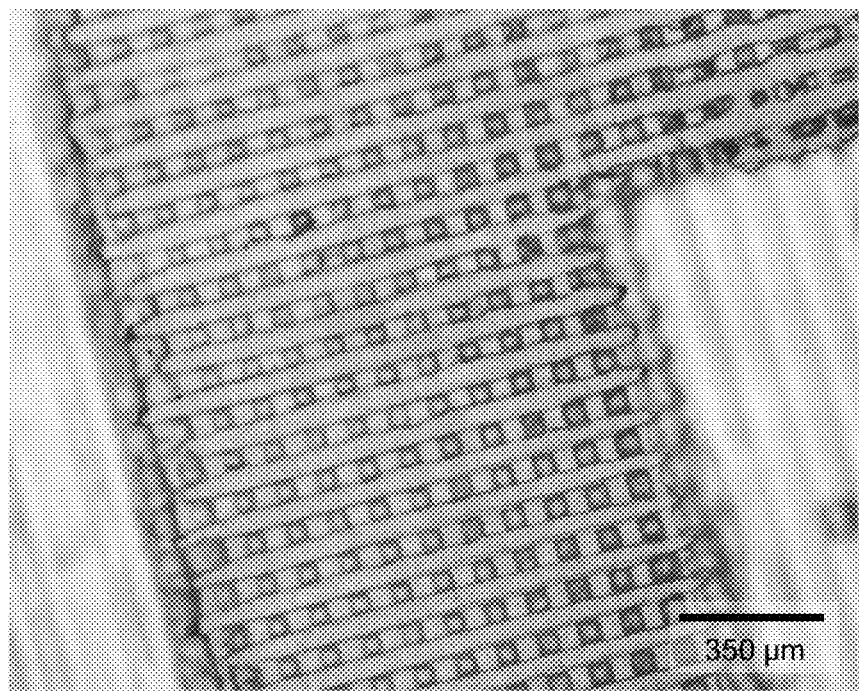
FIG. 7 a detail photograph of the object of FIG. 6.
Figure 8:
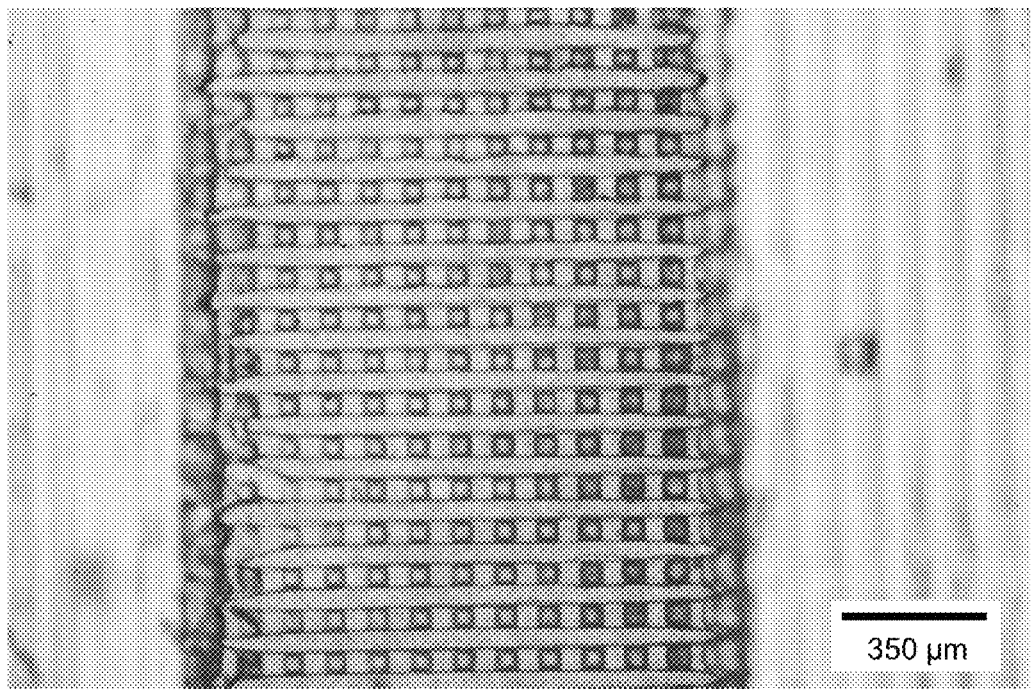
FIG. 8 a further detail of FIG. 6.

In FIG. 6, a picture of an object is shown that was 3D printed. The object has a first pattern showing relatively broad walls. In the relatively broad walls, a second pattern of a lower resolution is printed. In FIGS. 7 and 8, pictures are shown of these second patterns.

It will also be clear that the above description and drawings are included to illustrate some embodiments of the invention, and not to limit the scope of protection. Starting from this disclosure, many more embodiments will be evident to a skilled person. These embodiments are within the scope of protection and the essence of this invention and are obvious combinations of prior art techniques and the disclosure of this patent.

REFERENCE NUMBERS 1 stereolithographic printing assembly;
2 digital projection system;
3 photo mask system
4 printing surface;
5 displacement system (of an object that is printed)
6 container
7 polymerizable resin
8, 8' mask
9 actuator
10 collimating optics system
11 mirror
12 first pattern
13 object being printed
14 projection beam.
15 optically transparent bottom of the resin container

The invention claimed is:

1. A stereo lithographic 3D printing assembly comprising a digital projection system configured to project a digitally defined first pattern having a first resolution at a projection location, and a photo mask system configured to project a second pattern having a second resolution and said second pattern and said first pattern aligned with one another at said projection location, said photo mask system providing at least one photo mask between said digital projection system and said projection location.

2. The stereo lithographic 3D printing assembly of claim 1, wherein said second resolution is at least ten times higher than said first resolution at said projection location.

3. The stereo lithographic 3D printing assembly of claim 1, wherein said first resolution is lower than 200 dots per inch and said second resolution is higher than 200 dots per inch, or wherein said first resolution is lower than 250 dots per inch and said second resolution is higher than 250 dots per inch, or wherein said first resolution is lower than 100 dots per inch and said second resolution is higher than 300 dots per inch.

4. The stereo lithographic 3D printing assembly of claim 1, wherein said photo mask system comprises a substrate comprising at least part of said second pattern permanently defined on said substrate.

5. The stereo lithographic 3D printing assembly of claim 4, wherein said photo mask system comprises a series of substrates each comprising at least part of said second pattern permanently defined on said respective substrate.

6. The stereo lithographic 3D printing assembly of claim 1, comprising an alignment system having said second pattern and said first pattern aligned.

7. The stereo lithographic 3D printing assembly of claim 6, wherein said alignment system comprises an alignment provision on said digital projection system and on said photo mask system, a detector for detecting said alignment provision, and an alignment actuator for aligning said digital projection system and said photo mask system with respect to one another.

8. The stereo lithographic 3D printing assembly of claim 1, wherein said digital projection system comprises a source of electromagnetic radiation for producing a beam of electromagnetic radiation, collimating optics downstream of said source of electromagnetic radiation for collimating said beam of electromagnetic radiation, a digital mirror device downstream of said collimating optics, and an at least one axis translation device for translating said projection location, wherein said photo mask system is provided for positioning at least one photomask in a collimated beam of said collimating optics.

9. The stereo lithographic 3D printing assembly of claim 1, wherein said digital projection system comprises a light source, collimating optics downstream of said light source, a digital mirror device downstream of said collimating optics, and an at least one axis translation device for translating said projection location.

10. The stereo lithographic 3D printing assembly of claim 1, wherein said digital projection system comprises a patterned light source, collimating optics downstream of said patterned light source, and an at least one axis translation device for translating said projection location.

11. The stereo lithographic 3D printing assembly of claim 1, further comprising a container for holding a photo-curable resin and a target surface for defining said projection location for receiving a solidified layer that is polymerized with radiation from said digital projection system.

12. The stereo lithographic 3D printing assembly of claim 1, wherein said photo mask system comprises a series of photo masks and a selection system for selecting at least one of said photo masks for generating said second pattern.

13. The stereo lithographic 3D printing assembly of claim 1, wherein said photo mask system comprises an actuator for displacing said at least one photo mask during projecting of said first pattern for generating said second pattern, optionally said actuator comprises at least one selected from a translation stage and a rotation stage.

14. The stereo lithographic 3D printing assembly of claim 1, wherein said photo mask system is provided as an add-on system to a stereo lithographic 3D printing assembly.

* * * * *